United States Patent [19]

Spratt et al.

[11] Patent Number: 4,849,370
[45] Date of Patent: Jul. 18, 1989

[54] ANODIZABLE STRAIN LAYER FOR SOI SEMICONDUCTOR STRUCTURES

[75] Inventors: David B. Spratt; Eldon J. Zorinsky, both of Plano; Robert L. Virkus, Garland; Kenneth E. Bean, Richardson; Richard L. Yeakley, Dallas, all of Tex.

[73] Assignee: Texas Instruments Incorporated, Dallas, Tex.

[21] Appl. No.: 136,225

[22] Filed: Dec. 21, 1987

[51] Int. Cl.[4] .................. H01L 21/20; H01L 21/76
[52] U.S. Cl. .................... 437/71; 437/62; 437/67; 437/72; 204/15
[58] Field of Search .............. 204/15; 357/47, 49, 357/16; 437/61, 62, 67, 71

[56] References Cited

U.S. PATENT DOCUMENTS

| | | | |
|---|---|---|---|
| 4,104,090 | 8/1978 | Pogge | 437/71 |
| 4,459,181 | 7/1984 | Benjamin | 204/15 |
| 4,490,182 | 12/1984 | Scovell | 437/62 |
| 4,529,455 | 7/1985 | Bean et al. | 437/105 |
| 4,532,700 | 8/1985 | Kinney et al. | 204/15 |
| 4,659,400 | 4/1921 | Garbis et al. | 437/10 |
| 4,711,857 | 12/1987 | Cheng | 437/3 |
| 4,717,681 | 1/1988 | Curran | 437/31 |
| 4,760,036 | 7/1988 | Schubert | 437/62 |

FOREIGN PATENT DOCUMENTS

| | | | |
|---|---|---|---|
| 0148394 | 12/1978 | Japan | 437/62 |
| 0174736 | 8/1986 | Japan | 437/67 |

*Primary Examiner*—Brian E. Hearn
*Assistant Examiner*—Tom Thomas
*Attorney, Agent, or Firm*—George L. Craig; James T. Comfort; Melvin Sharp

[57] ABSTRACT

A silicon on insulator semiconductor structure employs a strain layer fabricated of an electrically inactive material. The strain layer comprises silicon with a germanium additive to produce a sublayer exhibiting a low breakdown voltage and thus effective for selective anodization.

15 Claims, 1 Drawing Sheet

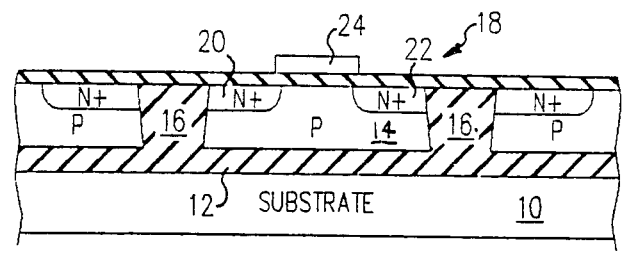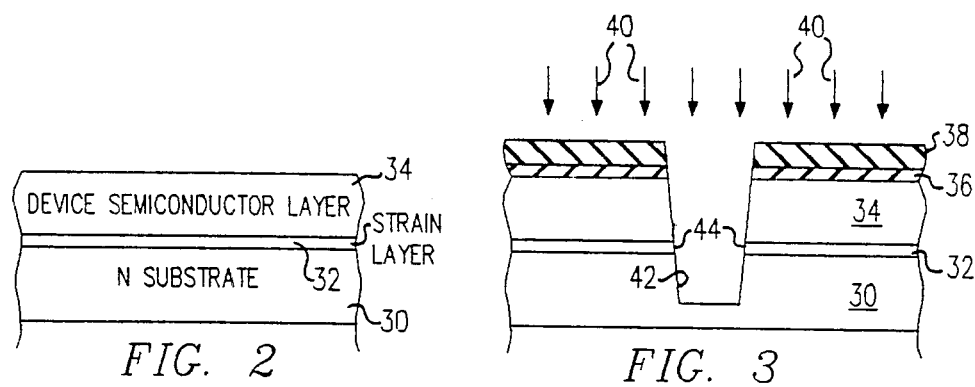

ANODIZABLE STRAIN LAYER FOR SOI SEMICONDUCTOR STRUCTURES

RELATED APPLICATIONS

"High Definition Anodized Sublayer Boundary", by Spratt et al., Ser. No. 806,258, filed Dec. 6, 1985, (Attorney Docket No. TI-11437).

"Semiconductor Isolation Using Trenches and Oxidation of Anodized Silicon Sublayer," by Spratt et al., Ser. No. 06/810,001, filed Dec. 17, 1985, (Attorney Docket No. TI-10399).

TECHNICAL FIELD OF THE INVENTION

The present invention relates in general to semiconductor isolation techniques, and more particularly relates to silicon on insulator (SOI) techniques and resulting structures.

BACKGROUND OF THE INVENTION

It is well known that superior performance can be obtained from devices integrated on semiconductor chips, when such devices, or groups of devices, are electrically isolated from each other on the chip substrate. In this manner, all undesirable parasitic coupling between such devices is eliminated, and all desired electrical connections are accomplished by interconnect paths formed on the surface of the substrate.

When integrated circuit devices, or circuits, are entirely isolated from the substrate, the prevalent latch-up in CMOS circuits is eliminated, and parasitic capacitances of all types of circuits are substantially reduced. With reduced parasitic capacitances, the circuits can operate at faster speeds.

Recent developments in semiconductor processing techniques have led to the silicon on isolator (SOI) technology which allows circuits to be entirely electrically isolated from the semiconductor substrate. The SOI technology involves the formation of a silicon dioxide (oxide) between the semiconductor substrate and an overlying semiconductor layer for forming therein the devices or circuits. The device semiconductor layer is thus electrically isolated from the substated. Moreover, the device semiconductor layer itself is further processed to isolate sections thereof corresponding to specific device or circuit areas. The device semiconductor layer is typically sectioned by trench structures, and thereafter the trenches are filled with an isolation dielectric, thereby forming semiconductor islands entirely isolated from each other and the chip substrate.

One technique for forming the isolation layer between the substrate and the device semiconductor layer involves the anodization of a heavily doped semiconductor sublayer and its subsequent oxidation to form a silicon oxide dielectric. Such a technique is disclosed in pending U.S. patent application entitled "High Definition Anodized Sublayer Boundary", identified above. Another SOI isolation technique is disclosed in U.S. Pat. No. 4,628,591, by Zorinsky et al., the subject matter of which is incorporated herein by reference. As is well known in the art, the use of a semiconductor material heavily doped with an electrically active impurity is advantageous for anodization purposes. Such a sublayer heavily doped with, for example, a phosphorus impurity, provides a preferential anodizable sublayer, in that such highly doped layer becomes anodized much before other more lightly doped adjacent semiconductor layers. While such a highly doped sublayer is well adapted for preferentially anodizing a selected area, the dopants tend to diffuse into the overlying device semiconductor layer, thereby degrading the performance of the devices formed therein. In order to fabricate high performance devices, subsequent process steps must be undertaken to remove the undesired up-diffusions, such as counter-doping techniques.

From the foregoing, it can be seen that a need exists for an improved technique for forming an isolated sublayer which eliminates the up-diffusion of impurities so that adjacent semiconductor areas remain unaffected by the formation of the isolation sublayer. Another need exists for an improved SOI technique which can be easily employed using currently available semiconductor processing apparatus and methods.

SUMMARY OF THE INVENTION

In accordance with the present invention, the disclosed silicon on insulator technique reduces or substantially eliminates the disadvantages and shortcomings associated with the prior art SOI structures and techniques. According to the invention, an insulated sublayer is formed using no electrically active impurities which can diffuse into the device semiconductor material. Rather, the semiconductor sublayer material of the invention comprises a silicon material having an electrically inactive additive, such as germanium. Such a sublayer interposed between doped silicon layers froms a strain layer which produces an internal electric field, thereby generating an excessive number of electrical hole carriers. Such a structure supports a high degree of anodization and thereby provides a preferential anodizable sublayer.

In the preferred embodiment of the invention, the strain sublayer is constructed with less than ten percent germanium, and with a thickness of less than one micron. The technical advantage presented by such a structure is that a very thin insulating layer can be formed between the substrate and the device semiconductor layer, and that no electrically active impurities are available for diffusing into the device semiconductor layer. Another technical advantage of the invention is that the silicon/germanium strain sublayer can be deposited using conventional epitaxial reactors.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same elements or regions throughout the views, and in which:

FIG. 1 is a sectional view of an exemplary SOI semiconductor wafer constructed according to prior art techniques; and FIGS. 2-7 are sectional views of a semiconductor wafer during successive processing steps for forming the silicon on insulator structure of the invention.

DETAILED DESCRIPTION OF THE INVENTION

The understanding of the present invention can be facilitated by first referring to FIG. 1 which illustrates a well-known silicon on insulator (SOI) structure. A typical SOI structure includes a semiconductor substrate 10 comprising a wafer or slice in which a large number of integrated circuit chips are fabricated. Fabricated on the substrate 10 is an electrically insulating sublayer 12 formed by silicon anodization and oxidation techniques, or other methods known in the art. Formed on the isolation sublayer 12 is a device semiconductor layer 14. The device semiconductor layer 14 is devided into sections by electrically insulating trenches 16. As noted, when the trench 16 is filled with a silicon oxide dielectric, such material becomes homogenous with the silicon oxide sublayer 12. The isolation trench structure 16 circumscribes a portion of the device semiconductor layer 14, thereby providing electrical isolation on all sides thereof from adjacent sections of the layer 14, as well as from the underlying substrate 10. Full isolation is thereby provided to one or more devices, such as shown by the MOS transistor 18 formed in the device semiconductor layer 14. Metallic or other conductive connections can be made on the surface of the wafer to the source 20, drain 22 and gate conductor 24 elements of the transistor 18.

As noted above, the isolation sublayer 12 is typically formed using a heavily doped N+ layer of silicon semiconductor material. Also as noted, the disadvantage is that the electrically active dopants diffuse into the device semiconductor layer 14, thereby degrading the performance of the devices formed therein. When forming MOS devices, the doping of the back channel thereof is altered, thereby posing the potential problem of inadvertent transistor conduction through the back channel, rather than through the channel area located between the source and drain regions 20 and 22. When forming bipolar transistors, and especially horizontal-operating bipolar devices, the sublayer dopants diffused into the device semiconductor layer alter the base profile of the transistor. Because the gain of a bipolar device is directly related to the uniformity of the base-emitter junction, and because the speed characteristics are determined in a large part by the substrate parasitic capacitances, such up-diffusion compromises the optimal electrical characteristics which can be realized from such devices.

With reference now to FIGS. 2–7, there is illustrated the major process steps in fabricating a silicon on insulator structure according to the invention.

With specific reference now to FIG. 2, an N-type substrate 30 is selected, having, for example, a resistivity of two to three ohm-cm and a <100> type of crystallographic structure. Formed on the substrate 30 is a strain layer 32 comprising principally a single crystal silicon material with a small amount of an electrically inactive material added thereto. In the preferred form of the invention, the electrically inactive material comprises germanium. As used herein, the term "electrically inactive" denotes a dopant material which cannot be interstitially located in a silicon crystal lattice structure and which can donate an electron. While germanium is a semiconductor material, it is itself electrically inactive, and thus well suited for use in constructing the strain sublayer 32. Therefore, it can be appreciated that other electrically inactive materials can be added to the silicon material to realize the advantages of the invention.

The strain sublayer 32 is formed on the substrate 30 by conventional epitaxial techniques. More particularly, the strain sublayer 32 can be deposited employing an in situ epitaxial process by blending a silicon-based and germanium-based gas in the reactor such that generally a silicon layer is formed, with a substantially even distribution of germanium atoms therein. Preferably, the strain sublayer 32 comprises about 2%-5% germanium atoms, by weight. Also, a thin strain sublayer 32 is desired, preferably in the range 0.1 to 1.5 microns thick.

A strain sublayer 32, of the noted construction, therefore comprises a single crystal structure having a residual strain therein due to the different lattice structures of the silicon and germanium crystal materials. A strain sublayer having mismatched crystal lattice structures allows the dopant impurities in adjacent doped silicon layers to contribute electrically charged holes or electrons to the strain sublayer. For example, the dopant impurities in the N-type substrate 30 supplies a large number of hole charges to the strain sublayer 32, thereby facilitating the anodization process. According to conventional semiconductor anodization techniques, a large dopant concentration enables selective or preferential anodization.

With regard again to FIG. 2, a device semiconductor layer 34 is shown deposited on the strain sublayer 32. The device semiconductor layer 34 is preferably doped with an N-type impurity, to function both as a material for forming therein semiconductor devices, as well as to give rise to the generation of hole charges in the underlying strain sublayer 32. Preferably, and as noted above, the strain sublayer 32 is thin so that the hole charges developed therein from the adjacent N-type layers 30 and 34 are substantially and uniformly distributed throughout the strain sublayer 32.

A further advantageous property of the strain sublayer 32 is its characteristic electric field which is sufficient to enhance or accelerate avalanche breakdown of the sublayer 32 during anodization, thereby generating additional hole charges which supports further anodization. As a result of the enhanced electrical field within the strain sublayer 32, the breakdown voltage thereof is reduced, as compared to the breakdown voltage of the substrate 30 and the device semiconductor layer 34. The strain sublayer 32, having a reduced breakdown voltage, thereby also facilitates selective anodization by permitting the anodizing current to flow through such sublayer 32, rather than through the substrate and device semiconductor layers 30 and 34 which exhibit inherently higher breakdown voltages.

With regard to the foregoing, it is to be noted that a further advantage of the strain sublayer 32 is its lowered band gap energy characteristic. The inherent band gap voltage of silicon is about 1.1 to 1.2 volts, while the band gap of germanium is about 0.87 volts. By mixing the silicon and germanium materials, the band gap energy thereof is lowered in an amount proportional to the concentration of the germanium additive. The band gap energy relates to the breakdown voltage of the strain sublayer 32 which, for low breakdown voltage materials, enhances avalanching and thus the creation of a large number of hole charges.

As illustrated in FIG. 3, the wafer is then covered with a thin layer of silicon nitride 36 which function as an oxidation mask for the top surface of the device semiconductor layer 34. Covering the silicon nitride layer 36 is a sacrificial silicon oxide layer 38. Both layers 36 and 38 can be deposited by low pressure chemical vapor deposition processes. The silicon nitride layer 38 may be about 1,000 angstroms thick, while the sacrificial oxide 38 is thicker, e.g., about 6500 angstroms. The silicon oxide layer 38 is termed "sacrificial" in that it protects the underlying silicon nitride layer 36 from being dissolved by the anodizing solution utilized in anodizing the strain sublayer 32. The sacrificial layer 38 also serves as a hard mask for the trench etch process.

The sacrificial oxide layer 38 and the underlying silicon nitride layer 36 are patterned by a photoresist to form openings to the substrate which ultimately define trench locations. A conventional plasma or reactive ion etch may be employed to remove the layered structure down to the N-type substrate 30. Isolation trenches of 1-2 microns in width can be formed with RIE etching techniques. The trench 42 is formed to a depth sufficient to expose an end face 44 of the strain sublayer 32. During the anodization process, in which the wafer is immersed in an electrolyte, such electrolyte fills the trench and provides the medium for contacting the low breakdown voltage strain sublayer 32 and enabling anodization of the silicon/germanium material.

FIG. 4 illustrates the wafer during the anodization process where the strain sublayer 32 is converted into a porous material. While not shown, the apparatus and equipment for carrying out semiconductor anodization is well known in the art, and further discussion thereof need not be described. In practice, a voltage is applied between the anodizing solution 46 and the backside of the substrate 30, thereby providing a potential across the wafer to allow the anodization current to pass therethrough. According to an important feature of the invention, the strain sublayer 32 is characterized by a large number of hole charges and a low breakdown voltage so that anodizing current passes therethrough and forms a porous silicon structure with pores 47. The anodizing process is continued until about fifty percent of the strain sublayer 32 has been removed, thereby forming a catacomb-like structure throughout the entire strain sublayer 32. As is well known in the art, during the anodization process, a space charge is formed around the porous areas to prevent further erosion, thereby resulting in the catacomb structure. In this manner, the anodizing electrolyte 46 permeates through the entire strain sublayer 32 and laterally anodizes the entire sublayer structure. Also, the sacrificial oxide layer 38 is removed during the anodization process. The silicon nitride layer 36 functions as an oxidation barrier during a subsequent process is which the wafer is subjected to a silicon oxidizing environment for converting the porous sublayer 32 into silicon oxide.

After the anodization process, the wafer is rinsed and cleaned by conventional techniques in preparation for a subsequent silicon oxidation of the porous sublayer 32. The porous slicon sublayer 32 may be converted into an insulating silicon oxide material by various techniques. In accordance with the preferred embodiment of the invention, the porous silicon sublayer 32 can be oxidized in a pyrogenic steam ambient of about 850° C., at a pressure of ten atmospheres. The oxidation process is carried out for a time sufficient to completely convert the porous silicon sublayer 32 into an insulating oxide. The thickness of the sublayer 32 does not significanty change during the oxidation process. This is due primarily to the porous nature of the sublayer 32 in which about 50%-60% of the material thereof is removed during the anodization step. As a result, the expansion or growth of the sublayer 32 during the oxidation stage occurs internally, thereby filling the catacomb structure with the silicon oxide isolation material. Of course, a portion of the silicon sidewalls of the trench 42 is also converted into a silicon oxide insulation layer, as is the underside of the unanodized layer 34 and the top of the substrate 30. Hence, some wafer expansion is noted after oxidation.

FIG. 5 illustrates the wafer subsequent to the sublayer oxidation, and after the nitride layer 36 has been removed. The wafer is further processed to refill the trenchs to provide lateral electrical isolation between the device semiconductor layer section., As depicted in FIG. 6, a layer 50 of insulating material, such as a conformal TEOS silicon oxide, is deposited over the surface of the wafer. As noted, the TEOS deposition is conformal, resulting in a surface cusp 52 which represents a surface irregularity. To remove the topographical irregularity from the surface of the wafer, a conventional nonconformal photoresist 54 is spun over the surface of the wafer. The photoresist 54 is preferably selected to have a characteristic etch rate substantially the same as that of the conformal oxide layer 50. The wafer is then etched to remove both the photoresist 54 and the surface oxide insulating layer 50. This latter etch process planarizes the surface of the wafer, as noted in FIG. 7, thereby providing a planar surface on which subsequent mask and process steps can be accomplished for forming the various semiconductor devices and circuits within the isolated device semiconductor sections.

From the foregoing, it can be seen that an improved silicon on insulator structure is disclosed. An important technical advantage presented by the invention is that an electrically inactive sublayer material is utilized in forming an isolation layer, which sublayer material does not give rise to up-diffusion of impurities into an overlying device semiconductor layer. The device semiconductor layer thereby maintains an uniform impurity concentration which is effective to fabricate therein high quality and high performance semiconductor devices. Another technical advantage of the invention is that the sublayer material of the invention comprises a strain layer which exhibits a low breakdown voltage to thereby facilitate the anodization process. Yet another technical advantage of the invention is that the strain layer and the anodization process can be carried out by utilizing conventional silicon semiconductor processing equipment. An additional technical advantage of the invention is that the strain sublayer does not contain electrically active dopants, but rather exhibits a low breakdown voltage, a low band gap energy, and a high electric field which is effective to accumulate electrically charged holes from the adjacent silicon semiconductor layers. In this manner, the strain sublayer can be preferentially anodized to thereby form a thin porous sublayer material.

While the preferred embodiment of the invention has been disclosed with reference to a specific strain sublayer, it is to be understood that many changes in detail may be made as a matter of engineering choices without departing from the spirit and scope of the invention, as defined by the appended claims.

What is claimed is:

1. A method for fabricating a silicon on insulator semiconductor structure, comprising the steps of:
   forming a strain layer on a substrate by depositing a silicon and germanium composition on said substrate;
   forming a semiconductor material on said strain layer;
   trenching said structure to provide access to said strain layer;

anodizing said strain layer to form a porous silicon material; and oxidizing said porous silicon material to form an insulating layer underlying said semiconductor material.

2. The method of claim 1, further including filling said trench with an insulator to provide lateral electrical isolation to said semiconductor material.

3. The method of claim 1, further including forming said strain layer as an electrically inactive layer.

4. The method of claim 1, further including forming said strain layer with a germanium content in the range of about 2%-5%.

5. The method of claim 1, further including forming said strain layer about 0.1 to 1.5 microns thick.

6. A method for fabricating a silicon on insulator semiconductor structure, comprising the steps of:

forming a strain layer with a material which is electrically inactive and which is capable of supporting a large number of electrical hole charges;

forming a semiconductor material on said strain layer;

trenching said structure to provide access to said strain layer;

anodizing said strain layer to form a porous material; and oxidizing said porous material to form an insulator underlying said semiconductor material.

7. The method of claim 6, wherein said strain layer is formed using silicon and germanium.

8. The method of claim 7, further including forming said strain layer by depositing the silicon and germanium using an in situ process.

9. The method of claim 7, further including forming said strain layer using silicon with less than ten percent germanium.

10. The method of claim 6, further including forming said strain layer sufficiently thin such that electrical hole charges are distributed therethrough.

11. A method for fabricating a silicon on insulator semiconductor structure, comprising the steps of:

forming a substrate;

forming a semiconductor device layer;

forming a strain layer between said substrate and said semiconductor device layer, and forming said strain layer with a material which is electrically inactive and which is characterized by a band-gap parameter which is less than that of said device layer and said substrate;

trenching said structure to provide access to said strain layer;

anodizing said strain layer to form a porous material; and oxidizing said porous material to form an insulator underlying said semiconductor device layer.

12. The method of claim 11, further including forming said strain layer with silicon and a germanium additive.

13. The method of claim 12, further including forming said strain layer with 2%-5% germanium.

14. The method of claim 12, further including adding a sufficient amount of germanium to a silicon material to form a strain in said strain layer.

15. The method of claim 14, further including adding sufficient germanium to lower the band-gap parameter so that said strain layer is preferentially anodizable with respect to said substrate and said semiconductor device layer.

* * * * *